United States Patent

Lefevre et al.

[11] Patent Number: 5,381,123
[45] Date of Patent: Jan. 10, 1995

[54] TRANSFORMER, ESPECIALLY A MEASUREMENT TRANSFORMER, FOR DETECTING FAULTS ON ELECTRICAL CABLES

[75] Inventors: Alain Lefevre, Fublaines; Jack Saintier, Sours, both of France

[73] Assignee: Etablissements Bardin, Boulogne-Billancort, France

[21] Appl. No.: 177,131

[22] Filed: Jan. 4, 1994

[30] Foreign Application Priority Data

Jan. 8, 1993 [FR] France ................ 93 00149

[51] Int. Cl.⁶ .................. H01F 27/02; H01F 27/26
[52] U.S. Cl. .................................. 336/90; 336/176
[58] Field of Search ............ 336/90, 92, 175, 176, 336/234; 324/127

[56] References Cited

U.S. PATENT DOCUMENTS

| | | | |
|---|---|---|---|
| 2,148,641 | 2/1939 | Reich | 336/176 |
| 3,725,832 | 4/1973 | Schweitzer, Jr. | |
| 4,005,380 | 1/1977 | Heilmann et al. | 336/176 |
| 4,234,863 | 11/1980 | Shumway et al. | |
| 4,408,175 | 10/1983 | Nelson et al. | |
| 5,039,970 | 8/1991 | Cox | 336/176 |

FOREIGN PATENT DOCUMENTS 497681  8/1992  European Pat. Off.
3318270 8/1984  Germany.

Primary Examiner—Thomas J. Kozma
Attorney, Agent, or Firm—Beveridge, DeGrandi, Weilacher & Young

[57] ABSTRACT

Transformer, especially a measurement transformer, for detecting faults on electrical cables, for example.

Transformer, comprising an elastically deformable split laminated cylindrical toroidal magnetic circuit (3), a screw-type assembly member (5), a coil (4) constituting its secondary and a casing (6) comprising a rigid casing part (19, 20) having side by side a housing (23) for the coil (4) and a housing (24) for the assembly member (5), the coil and the assembly member being fitted to a first end (8) of the toroidal magnetic circuit (3), and a deformable casing part (21) of annular ring segment shape one end of which is joined to the rigid casing part. The assembly member (15) includes an abutment (16) for defining the position of the first end (8) of the toroidal magnetic circuit and the deformable casing part has a length such that its second end cannot be locked to the rigid casing part unless the second end (9) of the toroidal magnetic circuit is fully engaged in the assembly member (5).

10 Claims, 3 Drawing Sheets

TRANSFORMER, ESPECIALLY A MEASUREMENT TRANSFORMER, FOR DETECTING FAULTS ON ELECTRICAL CABLES

The present invention concerns a transformer, especially a measurement transformer such as a transformer for detecting faults on electrical cables, for example, comprising a toroidal magnetic circuit and a coil thereon constituting the secondary of the transformer whose primary is constituted by a cable passing through the toroidal magnetic circuit.

Closed toroidal magnetic circuit transformers of this kind completely encased in a rigid resin encapsulation are known. Their main drawback is that to fit them to cables the latter must be disconnected so that the transformer can be threaded over the cable from one end.

To overcome this drawback it has been proposed to divide into two parts the toroidal magnetic circuit of such transformers, which are then known as split toroidal magnetic circuit transformers, and to encase each half in a respective rigid resin encapsulation, the two halves of the transformer being assembled together by means of a clamping ring, for example. The cost of such transformers is high.

Providing transformers of this kind with an elastic split toroidal magnetic circuit is also known. One particularly advantageous implementation of such split toroidal magnetic circuits is described in French patent application No 2 672 152. The toroidal magnetic circuit of this document is a split laminated cylindrical toroidal magnetic circuit which can be opened by elastic deformation and locked in the closed position, with its ends overlapping, by a screw-type assembly member. The cylindrical shape of the split toroidal magnetic circuit makes it particularly simple and convenient to fit the toroidal magnetic circuit around the cable.

However, at present these split toroidal magnetic circuit transformers are used with no encapsulation, i.e. with no protection of the magnetic circuit and the secondary thereon.

The present invention is directed to a transformer, in particular a measurement transformer such as a transformer for detecting faults on electrical cables, of the split toroidal magnetic circuit type in which both the magnetic circuit and the secondary are surrounded and protected by a covering without the latter affecting the ease with which the split toroidal magnetic circuit transformer can be fitted to the cable.

The invention consists in a transformer, especially a measuring transformer such as a transformer for detecting faults on electrical cables, comprising a split laminated cylindrical toroidal magnetic circuit which can be opened by elastic deformation and locked in the closed position with its ends overlapping by a screw-type assembly member. The transformer further comprises a coil mounted on the toroidal magnetic circuit. According to the invention the transformer further comprises a prefabricated casing adapted to enclose the transformer entirely and comprising a rigid first casing part having side by side a housing for receiving the coil constituting the secondary of the transformer and a housing for receiving the split toroidal magnetic circuit assembly member, the coil and the assembly member being engaged on a first end of the toroidal magnetic circuit. This casing further comprises a deformable second casing part of annular ring segment shape adapted to enclose the remaining part of the toroidal magnetic circuit, a first end of this deformable casing part being joined or joinable to the rigid casing part, at the coil housing end, and the second end of the deformable casing part being provided with means for locking it to the rigid casing part, at the assembly member housing end. The toroidal magnetic circuit assembly member includes an abutment for defining the position of the first end of the toroidal magnetic circuit and the deformable casing part has a length such that its second end cannot be locked to the rigid casing part unless the second end of the toroidal magnetic circuit is engaged in the assembly member to the depth required to be in the position overlapping the first end of the toroidal magnetic circuit and therefore in the assembly position.

The assembly member preferably includes guide means projecting from the rigid casing part to guide the second end of the toroidal magnetic circuit on engagement of the latter in the assembly member disposed in its housing in the rigid casing part.

For the deformable casing part, which is advantageously in one piece with the rigid casing part, to be easily deformable for fitting the transformer to the cable by opening the toroidal magnetic circuit, it advantageously has a corrugated structure over part at least of its length.

The deformable casing part preferably comprises in the lengthwise direction an alternation of rigid segments and corrugated segments, the corrugated segments preferably having thinner walls than the rigid segments.

In a preferred embodiment the rigid casing part comprises a back enclosing on three sides the coil and the assembly member, which can thus be introduced into the back via the open fourth side, and a lid adapted to close the fourth side.

Likewise, the deformable casing part is advantageously formed by a back surrounding the toroidal magnetic circuit on three sides (one edge and the opposite two larger sides) and a lid surrounding the toroidal magnetic circuit on the other edge. In this way it is easy, after fitting the coil and the assembly member to the toroidal magnetic circuit, to introduce the assembly into the back of the two casing parts and of the covering, the toroidal magnetic circuit then automatically assuming its correct position for opening it by elastic deformation to fit the transformer to the cable and for closing it by means of the assembly member.

The lid is preferably moulded in one piece with the back of the rigid casing part, to which it is articulated by a moulded-in hinge.

Snap-fastener means are then advantageously provided on the back and the lid of the rigid casing part to hold the lid closed.

On the deformable casing part the lid is advantageously a separate lid, the back and the lid also comprising snap-fastener means for holding the lid closed on the back.

The means for locking the second end of the deformable casing part to the rigid casing part are preferably on the lid of the deformable casing part and on the guide means provided on the assembly member.

It is also advantageous for the lid of the rigid casing part to be divided into a first lid part covering the housing for the coil and articulated to the back by said hinge and a second lid part connected by a hinge to the first lid part and covering the housing for the assembly member.

To provide a simple way to locate and centre the toroidal magnetic circuit correctly relative to the cable it is to fit around, the rigid casing part includes means preferably in one piece with the back of this part for pressing the transformer onto the cable. These means advantageously comprise a bearing surface, in the shape of a segment of a cylinder, for example, and at least one binding member, such as an elastic tie, for example, for fastening this bearing surface to the cable.

An illustrative and non-limiting embodiment of a transformer in accordance with the invention is described below in more detail with reference to the appended diagrammatic drawings in which.

Figure 1:
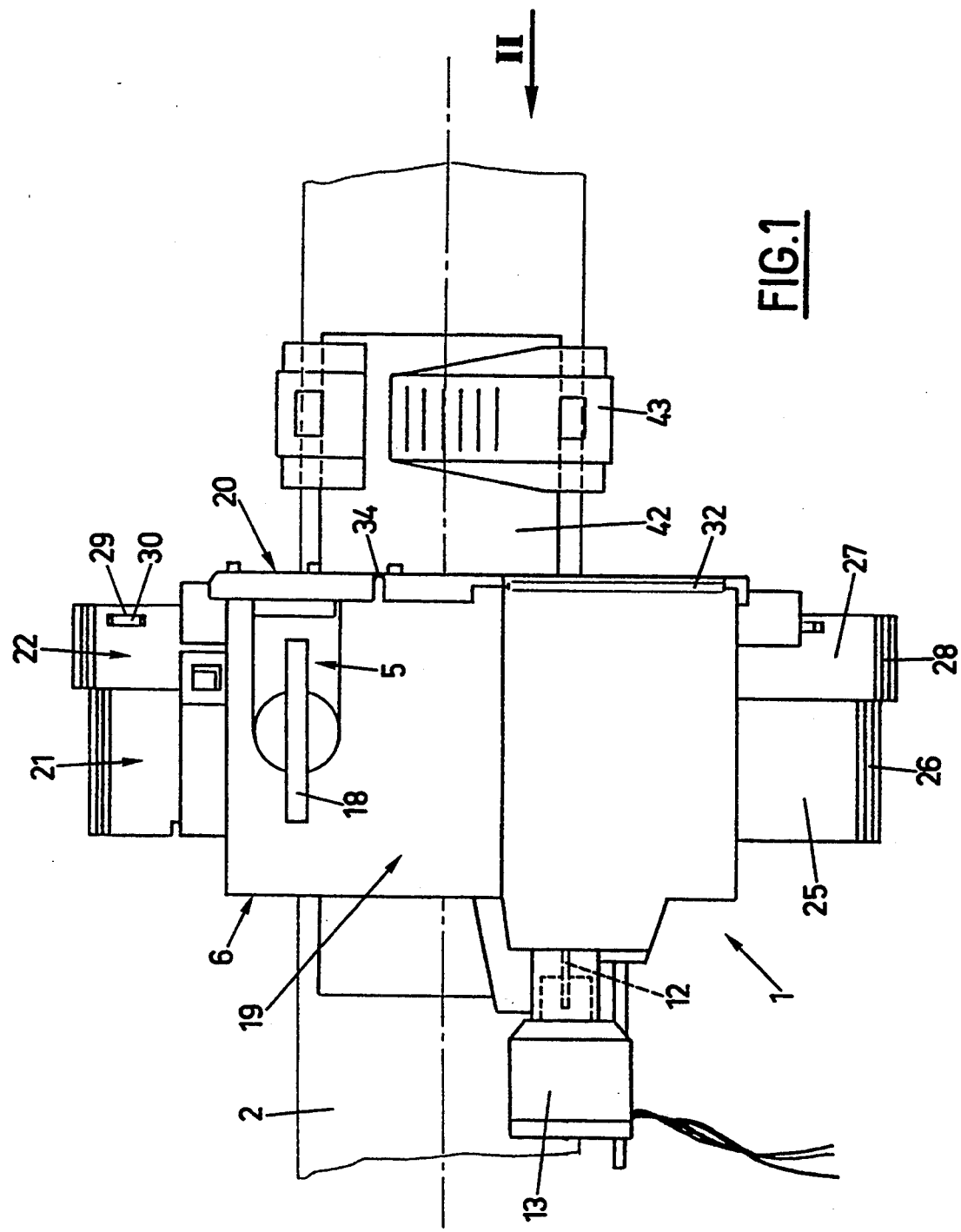
FIG. 1 is a side view as seen in the direction of the arrow I in FIG. 2 of a transformer in accordance with the invention fitted around an electric cable.
Figure 2:
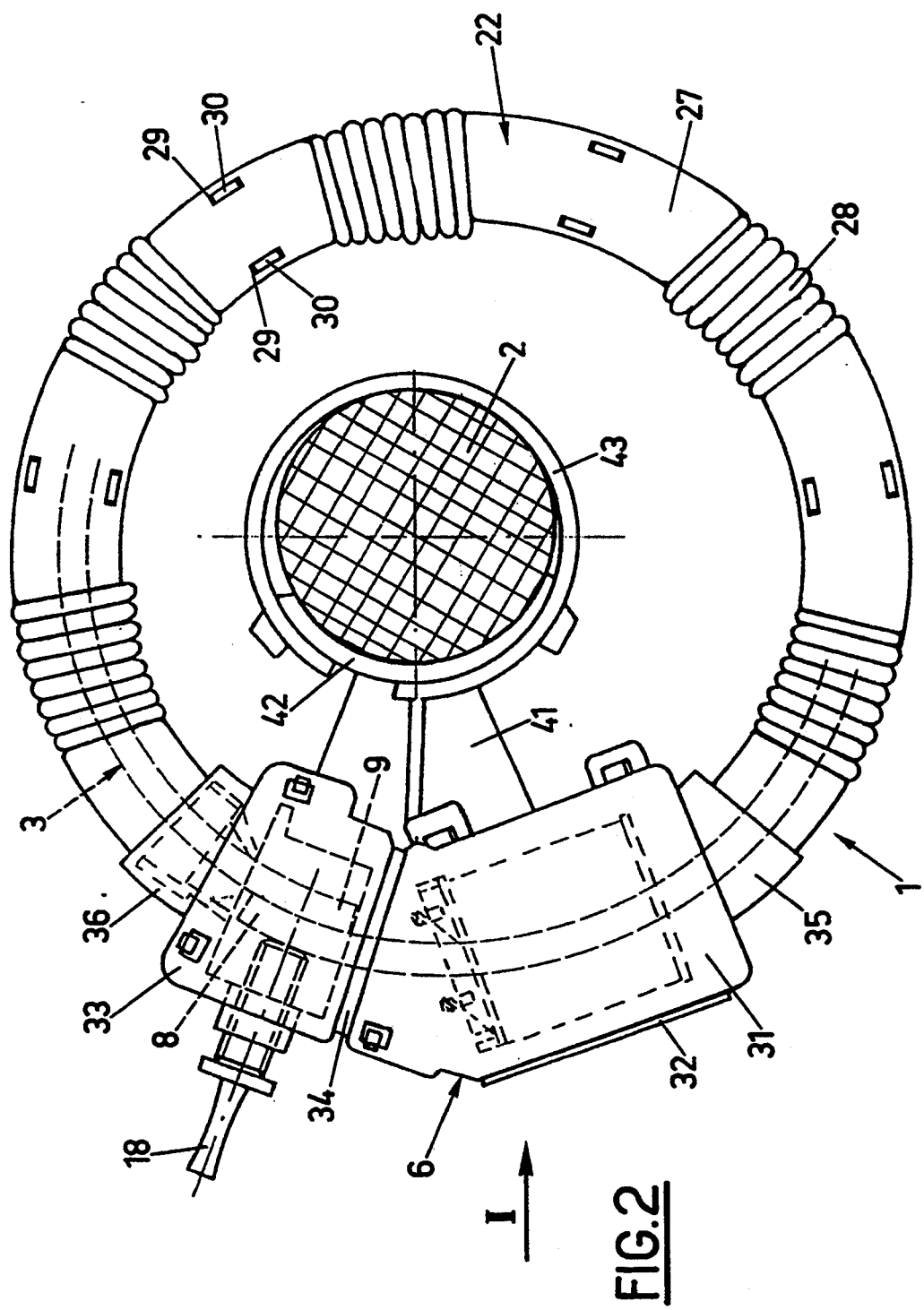
FIG. 2 is an end view of the same transformer as seen in the direction of the arrow II in FIG. 1.

Referring to FIGS. 1 and 2, a transformer 1, specifically a measurement transformer, is associated with a cable 2 for detecting faults in the current in said cable.

Figure 3:
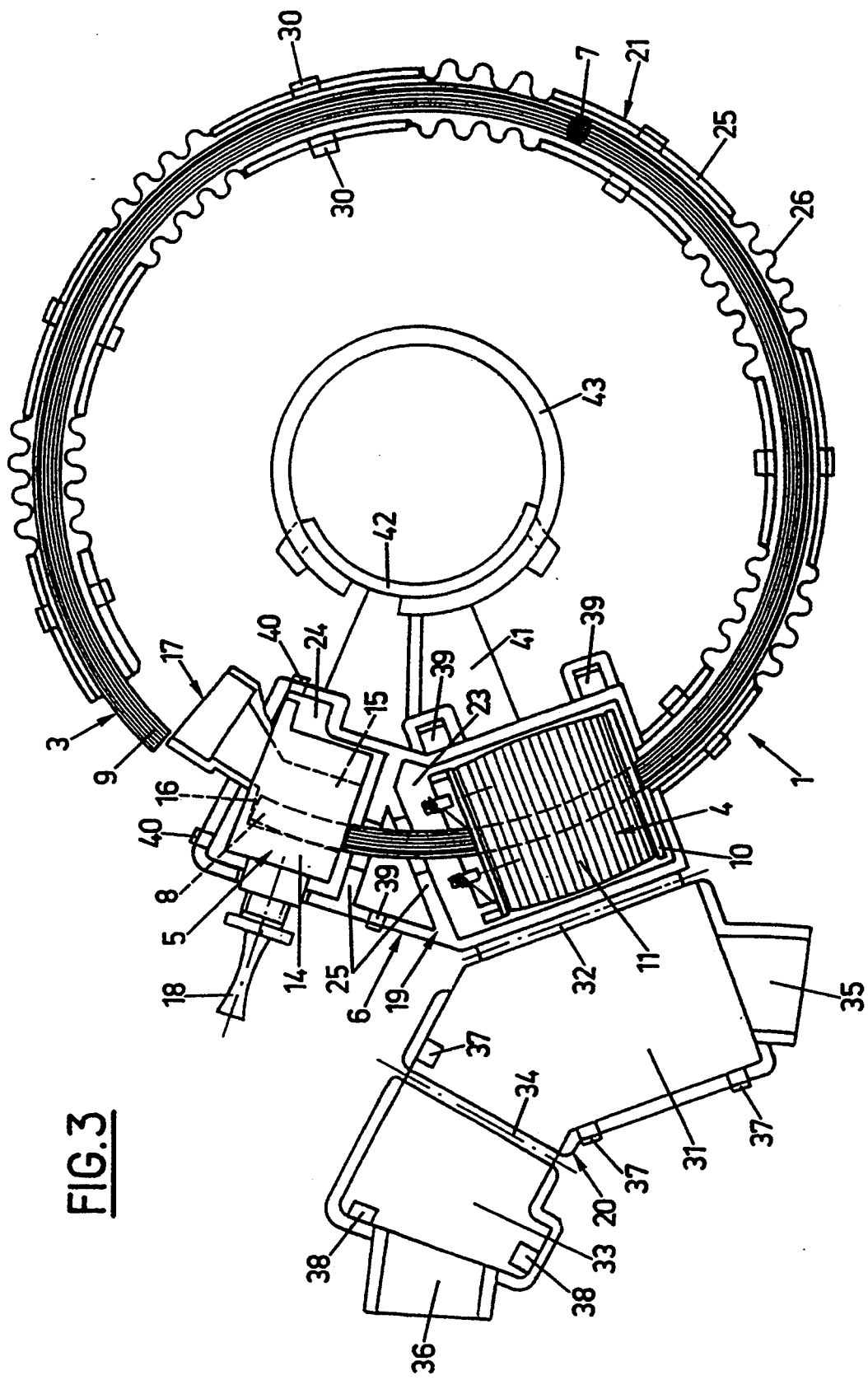
FIG. 3 shows the transformer from FIG. 2 with the casing open.

As shown by FIG. 3 especially, the transformer 1 (for which the cable 2 constitutes the primary) essentially comprises a magnetic circuit 3, a coil 4 providing the secondary, an assembly member 5 for the magnetic circuit 3 and a casing 6 enclosing the entire transformer.

The magnetic circuit 3 is constituted by a deformable laminated cylindrical toroidal magnetic circuit as disclosed in French patent application No 2 672 152. This split toroidal magnetic circuit is formed of a plurality of concentric split cylinders made from sections of thin plate held in position by two welds 7 on the opposite two edges of the toroidal magnetic circuit diametrally opposite the ends 8 and 9 of the toroidal magnetic circuit 3.

The coil 4 has a coilformer 10 through which the toroidal magnetic circuit 3 passes. This coilformer carries a winding 11 and terminals 12 with which a connector 13 shown in FIG. 1 cooperates.

The assembly member 5 is a generally parallelepiped-shaped body 14 through which passes a rectangular opening 15 whose width is slightly greater than the width of the toroidal magnetic circuit 3 and whose height is slightly greater than twice the thickness of the toroidal magnetic circuit 3, except at one mouth of the opening 15 where the height of the opening 15 is reduced by substantially half by an abutment 16 on its outermost side. On the same side of the body 14, the reduced height opening 15 is extended towards the outside of the body 14 proper by guide means 17 the function of which is described below.

The body 14 further includes in its outside wall a screwthreaded hole into which is screwed a locking screw 18 which can be operated by hand from outside the transformer.

The moulded plastics material casing 6 comprises (see FIG. 1 especially) a rigid part made up of a back 19 and a lid 20 and a deformable part likewise formed by a back 21 and a lid 22.

The back 19 of the rigid part encloses a housing 23 for the coil 4 and a housing 24 for the assembly member 5, the two side-by-side housings 23, 24 being separated by partitions 25 so that the coil 4 and the assembly member 5 are held in position in the housings 23 and 24 into which they can be slid from the open side of the back 19 of the rigid part.

As shown in FIG. 3, the back 19 further includes in the partitions 25 and in the opposite end walls notches disposed to allow simultaneous insertion in the back 19 not only of the coil 4 and the assembly member 5 but also of the part of the toroidal magnetic circuit 3 near the end 8 of the latter to which part the coil 4 and the assembly member 5 are previously fitted.

The back 21 of the deformable part of the casing is in one piece with the back 19 of the rigid part and joins onto the back 19 at the same end as the housing 23 for the coil 4. The back 21 is an annular circular segment into which the toroidal magnetic circuit 3 can be inserted by one edge so that the back 21 surrounds this edge and the two opposite sides of the toroidal magnetic circuit 3 correctly. The length of the back 21 of the deformable casing part is chosen so that when the toroidal magnetic circuit 3 is correctly engaged in the back 19 of the rigid casing part its first end 8 bears against the abutment 16 of the assembly member 5 and the second end 9 of the toroidal magnetic circuit 3 projects slightly from the free end of the back 21 of the deformable casing part.

Note that in the lengthwise direction the back 21 is formed by an alternation of rigid, thicker segments 25 and corrugated, thinner segments 26, the latter conferring upon the back 21 some capacity to deform elastically.

The lid 22 which is designed to cover the other edge of the toroidal magnetic circuit 3 also has a structure in the form of alternating rigid segments 27 and corrugated segments 28. The lid 22 includes snap-fastener means 29 cooperating when the lid 22 is attached to the back 21 with snap-fastener means 30 provided on the back to retain the lid to the back.

The lid 20 of the rigid casing part comprises a lid part 31 articulated by a hinge 32 to the part of the back 19 surrounding the housing 23 for the coil 4 and a lid part 33 connected to the lid part 31 by a hinge 34 so that when the lid part 31 is closed on the back 19 the lid part 33 can remain open. The lid part 31 has an extension 35 on one side and the lid part 33 has an extension 36 on the other side, the two extensions 35, 36 being shaped to cover the two ends of the lid 22 attached to the back 21 of the deformable casing part when the two lid parts 31 and 32 are closed.

The two lid parts 31 and 33 further have snap-fastener means 37 and 38 cooperating with snap-fastener means 39 and 40 of the back 19 in order to lock the lid 20 in the closed position.

Snap-fastener means (not shown) may also be provided at the free end of the deformable casing part, either on the back 21 or on the lid 22, to cooperate with snap-fastener means (not shown) provided on the guide means 17 of the body 14 of the assembly member 5 when (see FIG. 2) the second end 9 of the toroidal magnetic circuit 3 is fully engaged in the back 19, i.e. in the assembly position abutted against the partition 25, so locking the deformable casing part in this position on the rigid casing part.

Finally, the back 19 includes an internal support lug 41 carrying at its free inner end a bearing surface 42 in the shape of a cylindrical segment whose curvature matches the curvature of the cable 2. A binding member 43 consisting in this example of an elastic tie is used to attach the bearing surface 42 to the cable, in order to hold the transformer in place on the cable.

The mounting and use of the transformer in accordance with the invention are described next.

After manufacturing a transformer toroidal magnetic circuit 3 by the method disclosed in French patent application No 2 672 152, a coil 4 and an assembly member 5 are fitted to the first end 8 of the toroidal magnetic circuit with this end 8 of the toroidal magnetic circuit 3 bearing against the abutment 16. In this position the toroidal magnetic circuit 3 with the coil 4 and the assembly member 5 are engaged in the back 19, 21 of the casing 6, in the position shown in FIG. 3. The lid 22 is then applied and locked to the back 21 of the deformable casing part, the snap-fastener means 29, 30 preventing any unwanted separation of the lid 22 during subsequent deformation of the deformable casing part, and the lid parts 31 and 33 are closed onto the back 19 of the rigid casing part.

The assembled transformer is then ready to be fitted to a cable.

To fit the transformer to a cable 2 the binding member 43 is removed and the toroidal magnetic circuit 3 is opened by elastic deformation at the location of its deformable casing part 21, 22 by an amount sufficient to fit it over the cable 2. After the bearing surface 42 is positioned on the cable 2 the binding member 43 is replaced around the cable 2 with the result that the transformer is correctly positioned on the cable 2.

To close the toroidal magnetic circuit 3 it is compressed slightly inwards from the position shown in FIG. 3 to engage its second end 9 in the guide means 17. By pushing the two ends of the toroidal magnetic circuit 3 towards each other, the second end 9 is then inserted in the opening 15 in the assembly member 5, radially inside the first end 8 bearing against the abutment 16, until the end 9 comes into contact with the partition 25. The two ends 8 and 9 of the toroidal magnetic circuit 3 then overlap and the screw 18 is tightened to lock the two ends 8 and 9 of the toroidal magnetic circuit 3 in the overlapping position in the assembly member 5.

The embodiment shown and described has been shown and described by way of illustrative example only and numerous modifications and variations are possible within the scope of the invention.

This applies in particular to the means provided on the deformable casing part to render the latter deformable, the implementation of the lid 20 of the rigid casing part and its subdivision into two parts 31, 33, and the means for locking the lid 22 on the back 21 of the deformable casing part and the lid 20 on the back 19 of the rigid casing part.

A specific advantage of the transformer as shown and described is the facility to fit it "blind" onto a cable, by pressing the first end 8 of the toroidal magnetic circuit 3 against an abutment 16 of the assembly member 5 and by virtue of the guide means 17 provided on the assembly member 5 to move the second end 9 of the toroidal magnetic circuit 3 automatically into the correct position in the assembly member 5 (overlapping with the first end 8). This introduction of the second end 9 of the toroidal magnetic circuit 3 into the assembly member is facilitated by the fact the assembly member 5 has some clearance and therefore some play in its housing 24, as shown in FIG. 3.

Also, the back 21 of the deformable casing part, rather than being in one piece of the back 19 of the rigid casing part, could equally well be separate and joined to the back 19 by snap-fastener or like means, for example.

We claim:

1. Transformer comprising a split laminated cylindrical toroidal magnetic circuit which can be opened by elastic deformation and locked in a closed position with ends thereof overlapping by a screw-type assembly member and a coil providing a secondary fitted to said toroidal magnetic circuit, and a casing adapted to enclose the transformer entirely and including a rigid first casing part having, side by side, a housing for receiving the coil and a housing for receiving the assembly member, the coil and the assembly member being fitted to a first end of the toroidal magnetic circuit, and a deformable second casing part of an annular ring segment shape adapted to enclose a remaining part of the toroidal magnetic circuit, a first end of the deformable casing part being joinable to the rigid casing part, at the same end as the coil housing, and the second end of the deformable casing part being provided with means for locking to the rigid casing part at the same end as the assembly member housing, the assembly member including an abutment for defining the position of the first end of the toroidal magnetic circuit and the deformable casing part having a length such that the second end thereof cannot be locked to the rigid casing part unless the second end of the toroidal magnetic circuit is engaged in the assembly member to a depth required to be in the position overlapping the first end of the toroidal magnetic circuit, and therefore in the assembly position.

2. Transformer according to claim 1 wherein the assembly member includes guide means projecting from the rigid casing part to guide the second end of the toroidal magnetic circuit on engagement of the latter in the assembly member disposed in its housing in the rigid casing part.

3. Transformer according to claim 1 wherein the deformable casing part is in one piece with the rigid casing part.

4. Transformer according to claim 1 wherein the deformable casing part has a corrugated structure over at least part of its length.

5. Transformer according to claim 4 wherein the deformable casing part includes, in the lengthwise direction, alternate rigid segments and corrugated segments, the corrugated segments preferably having thinner walls than the rigid segments.

6. Transformer according to claim 1 wherein the rigid casing part includes a back enclosing on three sides the coil and the assembly member introduced into the back via the open fourth side, and a lid adapted to close the forth side.

7. Transformer according to claim 6 wherein the lid is in one piece with the back of the rigid casing part and is articulated to the back by a hinge.

8. Transformer according to claim 1 wherein the deformable casing part includes a back surrounding the toroidal magnetic circuit on three sides and a lid enclosing the other edge of the toroidal magnetic circuit.

9. Transformer according to claim 6 wherein the back and the lid include snap-fastener means for holding the lid closed on the back.

10. Transformer according to claim 1 wherein the rigid casing part includes means to press the transformer onto a cable, and at least one bind member.

* * * * *